United States Patent [19]
Thiel et al.

[11] Patent Number: 5,859,457
[45] Date of Patent: Jan. 12, 1999

[54] HIGH-VOLTAGE ISOLATED HIGH OUTPUT IMPEDANCE NMOS

[75] Inventors: Frank L. Thiel, Austin; Marco Corsi, Dallas, both of Tex.

[73] Assignee: Texas Instruments Incorporated, Dallas, Tex.

[21] Appl. No.: 847,461

[22] Filed: Apr. 24, 1997

[51] Int. Cl.$^6$ .................................................... H01L 29/78
[52] U.S. Cl. ........................ 257/335; 257/327; 257/341; 257/343; 257/369; 257/408; 438/197
[58] Field of Search ................................... 257/327, 335, 257/341, 343, 369, 408; 438/197

[56] References Cited

U.S. PATENT DOCUMENTS 5,777,362   7/1998   Pearce ...................................... 257/335

Primary Examiner—Edward Wojciechowicz
Attorney, Agent, or Firm—Alan K. Stewart; Wade James Brady, III; Richard L. Donaldson

[57] ABSTRACT

A semiconductor transistor device includes a first doped region 34 of a first conductivity type; a second doped region 30 of the first conductivity type formed at the surface of the first doped region 34, the second doped region 30 has a higher doping concentration than the first doped region 34; a source region 24 of a second conductivity type formed at the surface of the second doped region 30; a lightly doped drain region 28 of the second conductivity type surrounding the first doped region 34, the lightly doped drain region 28 has a lower doping concentration than the source region 24, the lightly doped drain region 28 is spaced apart from the second doped region 30; a buried layer 40 of the second conductivity type below the first doped region 34 and coupled to the lightly doped drain region 28; and a gate 32 overlying and spaced apart from the first doped region 34 and the second doped region 30.

17 Claims, 5 Drawing Sheets

HIGH-VOLTAGE ISOLATED HIGH OUTPUT IMPEDANCE NMOS

FIELD OF THE INVENTION

This invention generally relates to electronic semiconductor devices. More specifically, the invention relates to NMOS transistors.

BACKGROUND OF THE INVENTION

Typical prior art NMOS devices usually handle the least voltage of all the devices in a BiCMOS process. This is due to the ability of the device to easily avalanche and cause excess electron flow, the electron being the majority carrier for this device. Additionally, in a typical CMOS process, (P substrate), this device must have its back-gate tied to substrate, causing undesirable threshold voltage shifting due to the body-effect when the source is raised in potential above the substrate. Lastly, NMOS devices typically have a lower output impedance per unit of channel length than do PMOS devices, again due to the ability of the N type drain material to create a strong depletion region. Low output impedance is generally undesirable as it causes non-linearities in analog circuitry.

Often it is necessary to achieve higher voltages than a normal CMOS process typically allows. Additionally, in linear circuits, especially when source-followers are needed, the increased threshold voltage created by back-gate tied to a P-substrate while the source goes to a positive voltage (body effect) can cause loss of headroom. Also, a device, especially in source followers, can often need to have a low threshold voltage to achieve headroom. Lastly, the output impedance of shorter channel NMOS devices can be lower than desired.

SUMMARY OF THE INVENTION

Generally, and in one form of the invention, a semiconductor transistor device includes a first doped region of a first conductivity type; a second doped region of the first conductivity type formed at the surface of the first doped region, the second doped region has a higher doping concentration than the first doped region; a source region of a second conductivity type formed at the surface of the second doped region; a lightly doped drain region of the second conductivity type surrounding the first doped region, the lightly doped drain region has a lower doping concentration than the source region, the lightly doped drain region is spaced apart from the second doped region; a buried layer of the second conductivity type below the first doped region and coupled to the lightly doped drain region; and a gate overlying and spaced apart from the first doped region and the second doped region.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
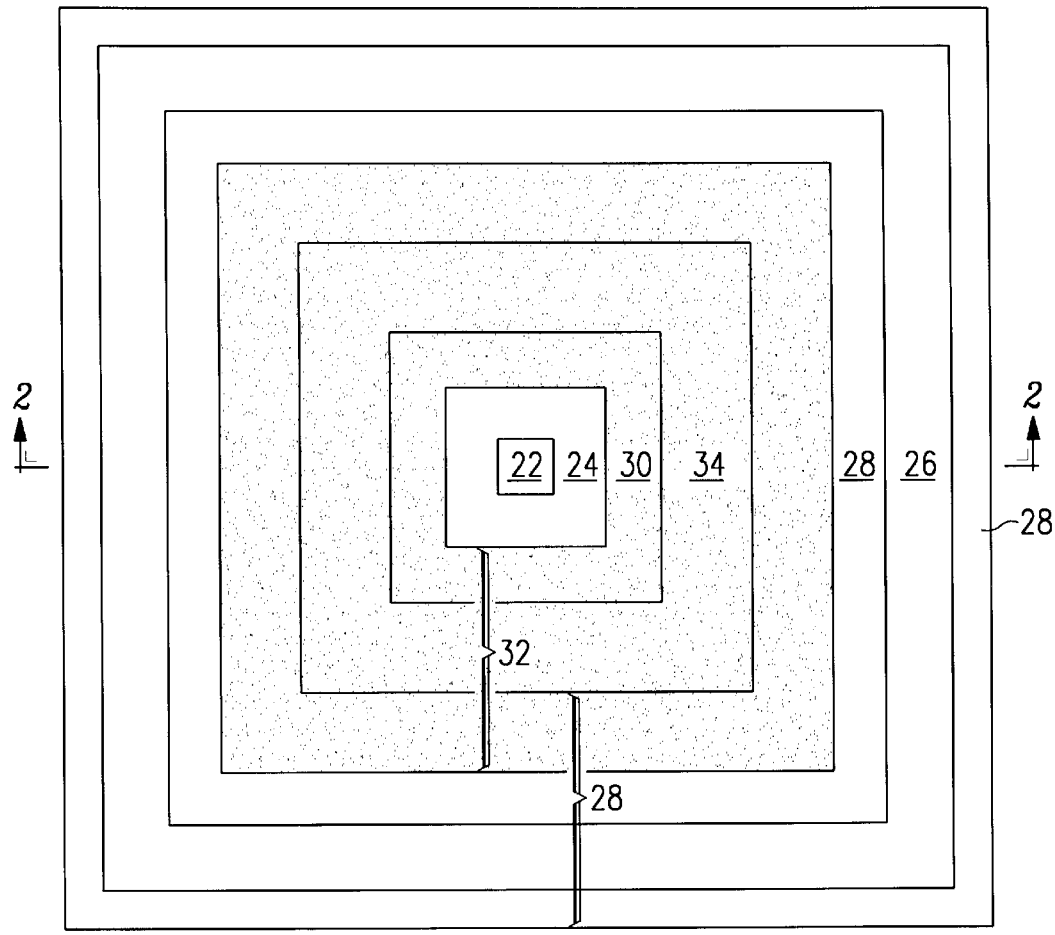
FIG. 1 is a plan view of a preferred embodiment lightly doped drain; isolated backgate, high voltage NMOS with a near zero threshold voltage.
Figure 2:
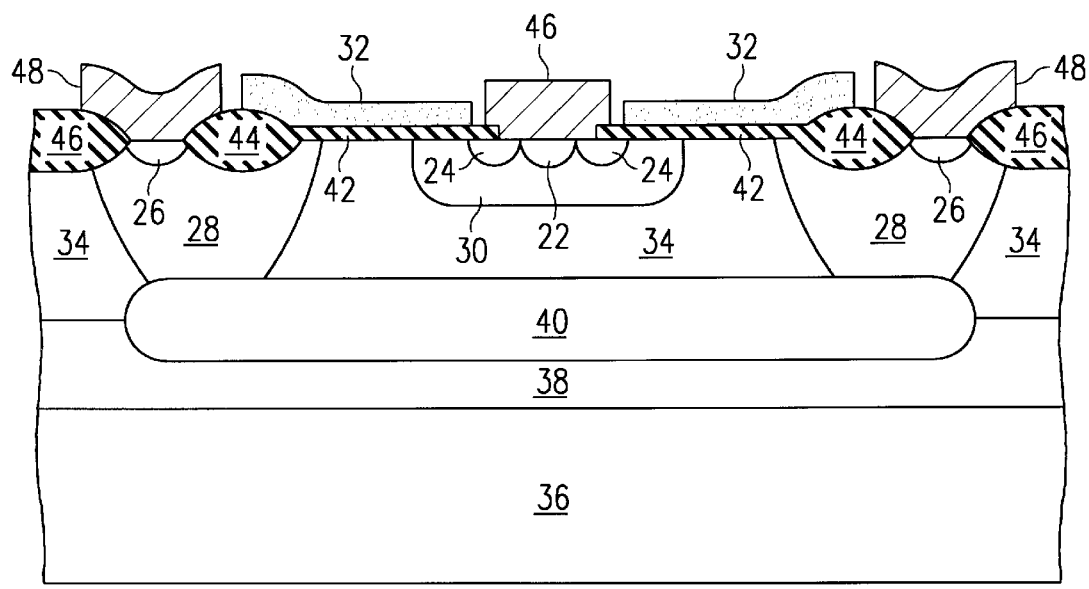
FIG. 2 is cross-sectional diagram of the device of FIG. 1.

The preferred embodiment shown in FIGS. 1 and 2 is a lightly doped drain, isolated backgate, high voltage NMOS with a near zero threshold voltage. This device is achieved in a P– substrate/N– well CMOS technology with the addition of an isolating N+buried layer and a P adjustment step.

FIG. 1 is a plan view of the preferred embodiment lightly doped drain, isolated backgate, high voltage NMOS with a near zero threshold voltage. The device of FIG. 1 includes P+ back gate 22, N+ source 24, N+ drain 26, N– well 28 (lightly doped drain), P region 30, polysilicon gate 32, and P– epitaxial region 34.

FIG. 2 is cross-sectional diagram of the device of FIG. 1. FIG. 2 includes P+ back gate 22, N+ source 24, N+ drain 26, N– well 28, P region 30, polysilicon gate 32, P– epitaxial region 34, P+ substrate 36, P– epitaxial layer 38, N+ buried layer 40, gate oxide layer 42, field oxide regions 44 and 46, and metal contacts 46 and 48. FIGS. 3 through 10, show the device of FIG. 2 at several stages of fabrication.

The preferred embodiment is an isolated NMOS constructed in a BiCMOS process. By isolating the device with a low-concentration N-type drain material 28, it can withstand voltages an order of magnitude higher than conventional prior art devices. Previous isolation techniques often can not achieve as high a break-down voltage due to vertical punch-through to the source. The back-gate of the preferred embodiment uses a graded P-type doping that both prevents premature breakdown due to vertical punch-through, and dramatically increases the device's output impedance by controlling the drain depletion region. By constructing this device in an annular fashion, the isolation region is the same region as the drain, which reduces parasitic capacitance. The preferred embodiment produces a more area efficient, higher voltage, higher output impedance, and body effect insensitive device than typical prior art NMOS transistors and typical prior art high-voltage isolation schemes.

Figure 3:
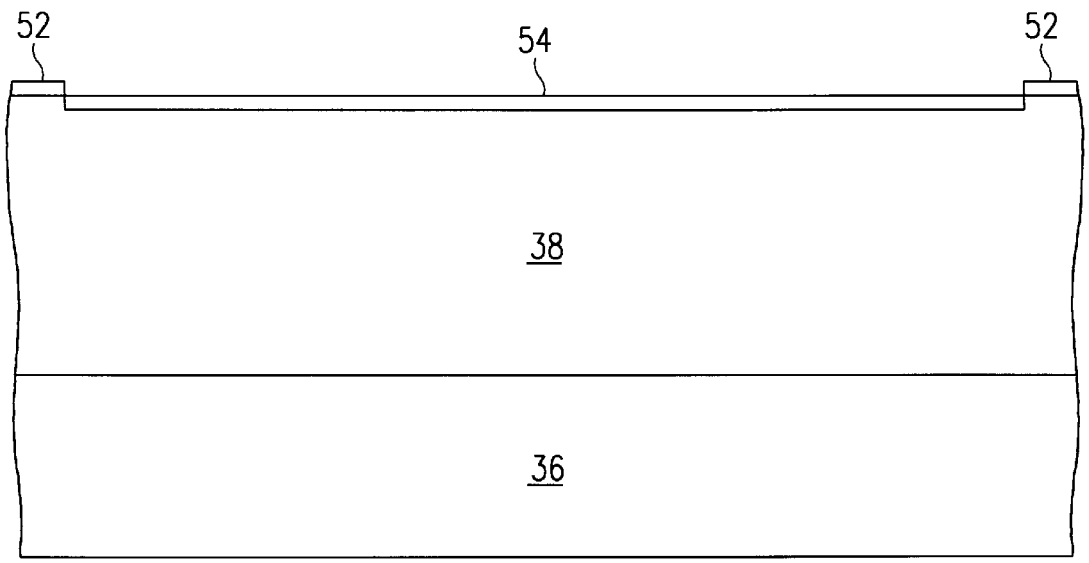
FIGS. 3 through 10 are cross-sectional views showing the device of FIG. 2 in various states of fabrication.
Figure 4:
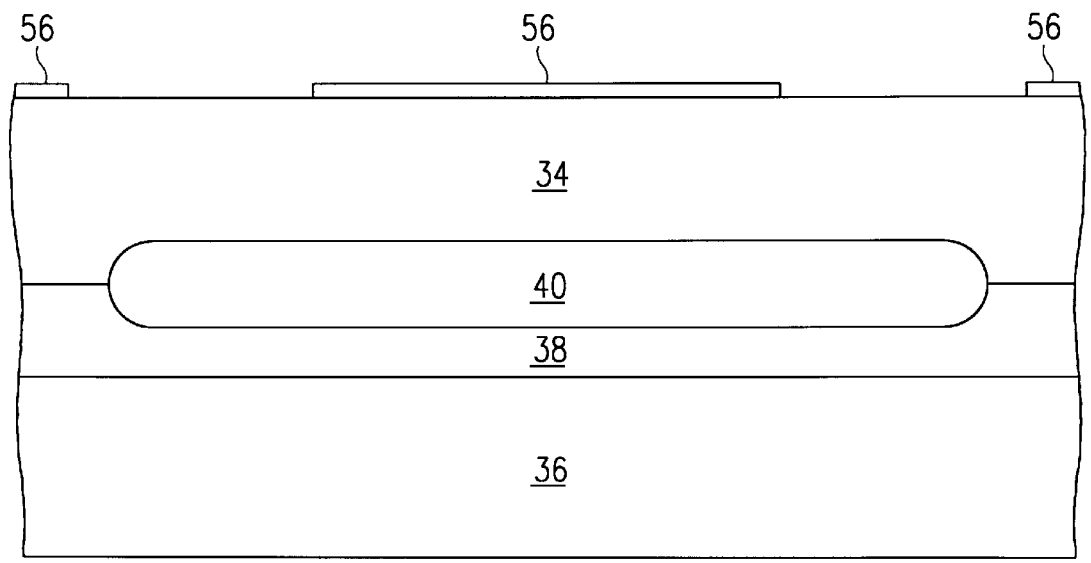

Referring to FIGS. 3 through 10, a method of forming the preferred embodiment of FIG. 2 is described in detail. FIG. 3 illustrates a P– epitaxial layer 38 over a P+ substrate 36. P– epitaxial layer 38 is grown on P– substrate 36 according to well known techniques. An oxidation layer 52 on the order of 7500 angstroms is then formed on the surface of P– epitaxial layer 38. Oxide layer 52 may be formed according to any one of a number of well-known techniques. For example, oxide layer 52 may be a grown silicon oxide. Oxide layer 52 is then patterned and etched for the formation of N+ buried layer 40. A dopant such as antimony (e.g. 6.0 E15 ions/cm$^2$ at 60 KeV) is implanted into P– epitaxial layer 38 to form implant region 54, shown in FIG. 3, and diffused for 30 minutes at 1250° C. Then P– epitaxial layer 34 is formed over P– epitaxial layer 38, as shown in FIG. 4.

Figure 5:
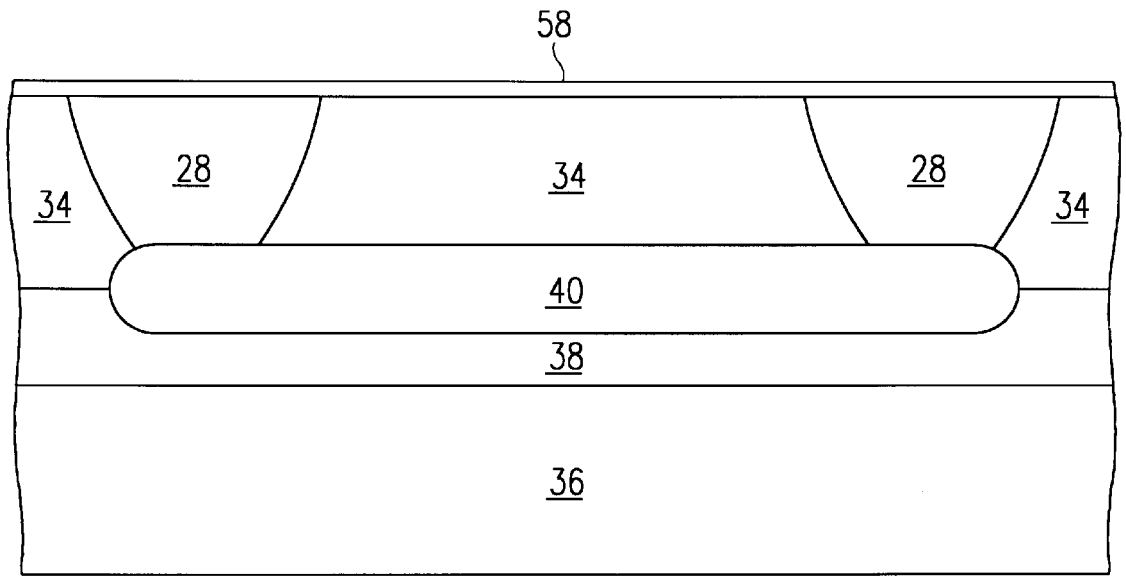
Figure 6:
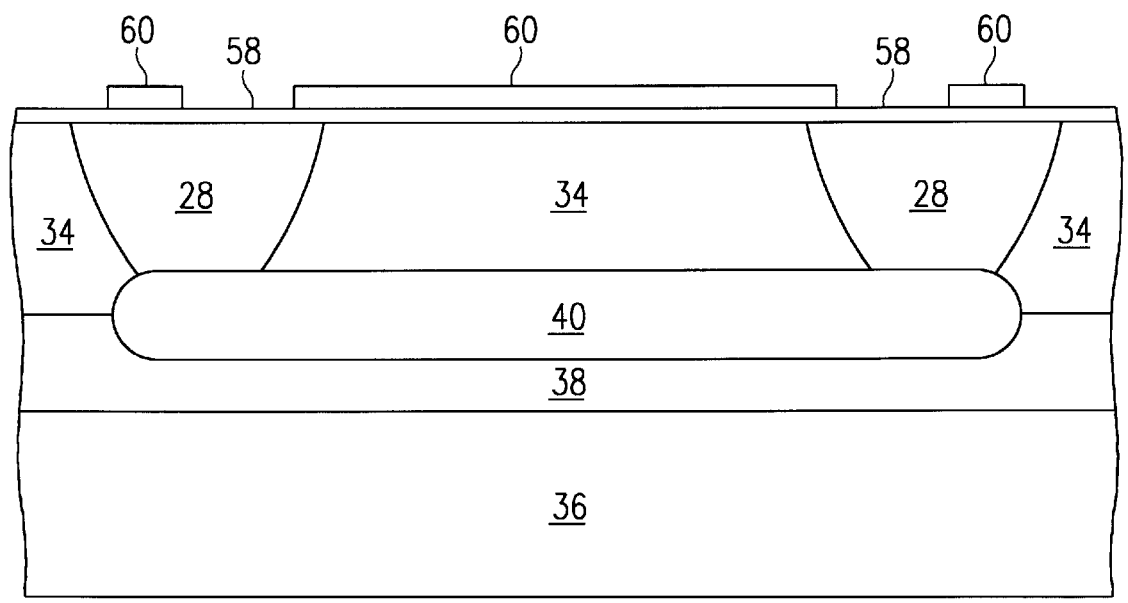
Figure 7:
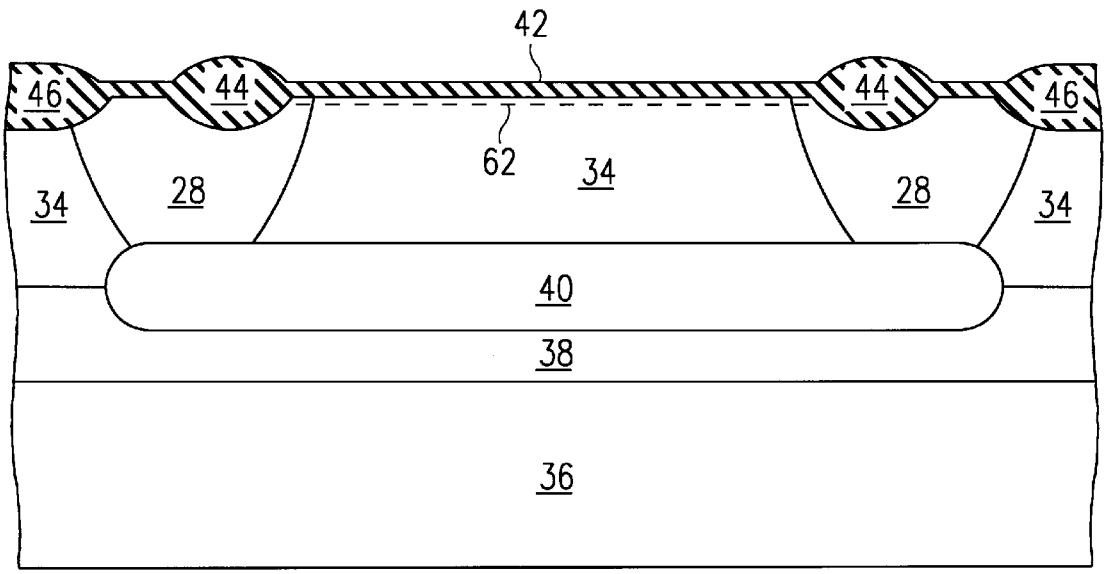

Next, oxide layer 56 is formed over the surface of P– epitaxial layer 34. Oxide layer 56 is then patterned and etched, as shown in FIG. 4, for the foundation of N– well 28. A dopant such as phosphorous (e.g. 3.7 E12 ions/cm$^2$ at 150 KeV) is implanted and diffused for 860 minutes at 1150° C. to form N– well 28, as shown in FIG. 5. Pad oxidation layer 58 is then formed with a thickness of about 500 angstroms. Next, a nitride layer of about 1400 angstroms is deposited, patterned, and etched to form nitride layer 60, shown in FIG. 6. Field oxide regions 44 and 46 are then formed, as shown in FIG. 7. Then nitride layer 60 is stripped and gate oxide layer 42 is formed, as shown in FIG. 7. The surface is then patterned and a dopant such as phosphorous is implanted through the exposed gate oxide layer 42 to form threshold adjust implant 62, shown in FIG. 7.

Figure 8:
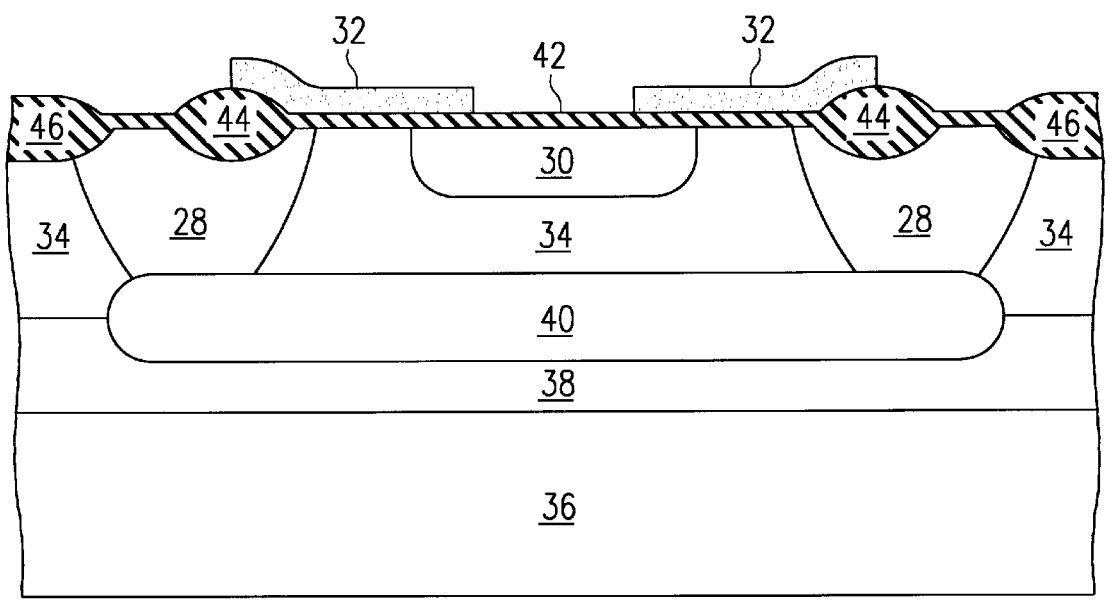
Figure 9:
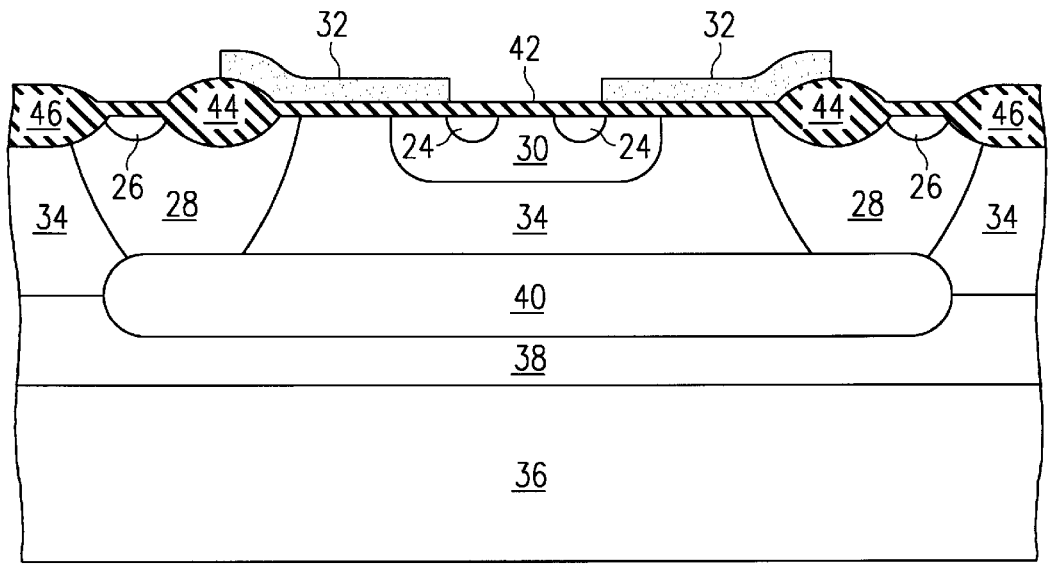
Figure 10:
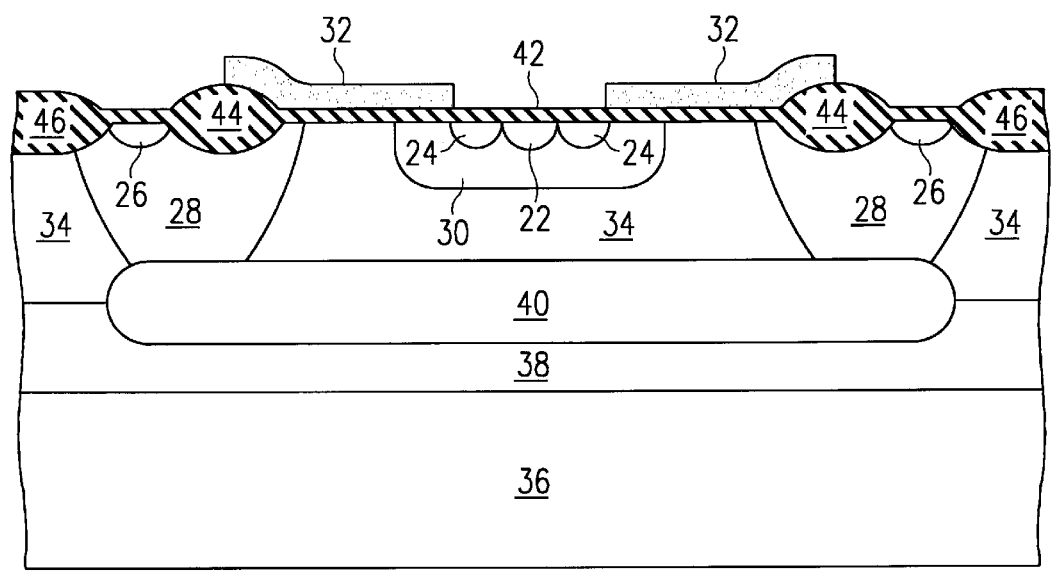

Next, a polysilicon layer is deposited, patterned, and etched to form polysilicon gate 32 with a thickness of about 5000 angstroms, as shown in FIG. 8. Then P region 30 is patterned and a dopant such as boron is implanted through the exposed gate oxide layer and diffused to form P region 30, shown in FIG. 8, which is self aligned to polysilicon gate 32. The N+ source/drain is then patterned and implanted using a dopant such as arsenic (e.g. 8.0 E15 ions/cm$^2$ at 135 KeV) to form N+ source 24 and N+ drain 26, as shown in FIG. 9. The implant is followed by an anneal for 30 minutes at 1000° C. Then P+ backgate 22 is patterned and implanted using a dopant such as boron (e.g. 4.0 E15 ions/cm$^2$ at 40 KeV) to form P+ backgate 22, as shown in FIG. 10. Metal contacts 46 and 48 are then formed, as shown in FIG. 2.

The preferred embodiment provides several improvements over a standard prior art NMOS. The $BV_{DSS}$ of the device is increased from around 15 volts to over 50 volts by using the N– well implant 28 as the drain. This is a much more lightly doped diffusion than the N+ source/drain step. By constructing an annular structure and using the N+ buried layer 40, the P epitaxial region 34 that serves as the backgate is effectively isolated inside the device. The backgate is integrally shorted to the source 24 to save area and eliminate body effect.

By implanting a P region 30 beneath the source 24, the punch through from N+ buried layer 40 to source 24 is raised to over 50 volts. The device without the P region 30 has an unimplanted threshold voltage of approximately 0.1 volt to achieve near rail-to-rail source follower amplifier outputs. The P region 30 raises the threshold voltage to approximately 0.5 volts. By implanting phosphorous into the surface, as shown by implant region 62 in FIG. 7, the threshold is reset to approximately 0.1 volts. However, the device is deliberately constructed to have the phosphorous implant 62 adjust both the part of the channel that has only the P epitaxial region 34 below, as well as the added P region 30.

Figure 11:
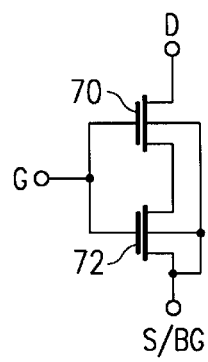
FIG. 11 is a circuit diagram of the structure in FIGS. 1 and 2.

The phosphorous implant 62 has two desirable effects. First, it reduces the impact of N well out diffusions and misalignment on the channel by causing the effective channel to be the p region 30. Second, it places a depletion device of approximately –0.4 volts in series, effectively boosting the device's output impedance. This is shown in schematic form in FIG. 11. FIG. 11 includes transistors 70 and 72. The source/backgate S/BG, drain D, and gate G in FIG. 11 corresponds with source 24 and backgate 22, drain 26, and gate 32, respectively, in FIG. 2. The effective channel for transistor 70 is from the inner edge of N well 28 to the edge of P region 30. The effective channel for transistor 72 is from the edge of P region 30 to the inner edge of polysilicon gate 32. The threshold voltage for transistor 70 is approximately –0.4 volts. The threshold voltage for transistor 72 is approximately 0.1 volts.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A semiconductor transistor device comprising:
    a first doped region of a first conductivity type;
    a second doped region of the first conductivity type formed at the surface of the first doped region, the second doped region has a higher doping concentration than the first doped region;
    a source region of a second conductivity type formed at the surface of the second doped region;
    a lightly doped drain region of the second conductivity type surrounding the first doped region, the lightly doped drain region has a lower doping concentration than the source region, the lightly doped drain region is spaced apart from the second doped region;
    a buried layer of the second conductivity type below the first doped region and coupled to the lightly doped drain region; and
    a gate overlying and spaced apart from the first doped region and the second doped region.

2. The device of claim 1 further comprising a back gate region of the first conductivity type formed at the surface of the second doped region, the back gate region has a higher doping concentration than the second doped region, the source region surrounds the back gate region.

3. The device of claim 1 further comprising a highly doped drain region of the second conductivity type formed at the surface of the lightly doped drain region, the highly doped drain region has a higher doping concentration than the lightly doped drain region.

4. The device of claim 1 further comprising a threshold adjust implant of the second conductivity type at the surface of the first doped region and the second doped region.

5. The device of claim 1 further comprising a gate oxide region between the gate and the first and second doped regions.

6. The device of claim 3 further comprising a field oxide region separating the gate from the highly doped drain region.

7. The device of claim 1 further comprising a metal contact coupled to the source region.

8. The device of claim 3 further comprising a metal contact coupled to the highly doped drain region.

9. The device of claim 1 further comprising a doped layer of the first conductivity type below the buried layer.

10. The device of claim 9 further comprising a substrate of the first conductivity type below the doped layer.

11. The device of claim 2 further comprising a metal contact coupled to the source region and the back gate region.

12. The device of claim 1 wherein the buried layer has a higher doping concentration than the lightly doped drain region.

13. The device of claim 1 wherein the first doped region, the second doped region, the source region, and the lightly doped drain region are formed in an epitaxial layer.

14. The device of claim 1 wherein the buried layer is formed at the boundary of two epitaxial layers.

15. The device of claim 1 wherein the first conductivity type is P type and the second conductivity type is N type.

16. The device of claim 1 wherein the gate is polysilicon.

17. A method for making a semiconductor transistor device comprising:
    forming a first doped region of a first conductivity type;
    forming a second doped region of the first conductivity type at the surface of the first doped region, the second doped region has a higher doping concentration than the first doped region;

forming a source region of a second conductivity type at the surface of the second doped region;

forming a lightly doped drain region of the second conductivity type surrounding the first doped region, the lightly doped drain region has a lower doping concentration than the source region, the lightly doped drain region is spaced apart from the second doped region;

forming a buried layer of the second conductivity type below the first doped region and coupled to the lightly doped drain region; and forming a gate overlying and spaced apart from the first doped region and the second doped region.

* * * * *